(12) United States Patent
Klatt

(10) Patent No.: US 8,420,497 B2
(45) Date of Patent: Apr. 16, 2013

(54) SEMICONDUCTURE STRUCTURE AND METHOD OF FORMING THE SEMICONDUCTOR STRUCTURE THAT PROVIDES TWO INDIVIDUAL RESISTORS OR A CAPACITOR

(75) Inventor: Jeffrey Klatt, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/486,149

(22) Filed: Jun. 1, 2012

(65) Prior Publication Data
US 2012/0244676 A1 Sep. 27, 2012

Related U.S. Application Data

(62) Division of application No. 12/789,539, filed on May 28, 2010, now Pat. No. 8,193,603.

(51) Int. Cl.
*H01L 21/02* (2006.01)

(52) U.S. Cl.
USPC .................................. 438/381; 438/957

(58) Field of Classification Search ............... 438/381, 438/957; 257/E21.011
See application file for complete search history.

(56) References Cited

U.S. PATENT DOCUMENTS
2010/0261347 A1* 10/2010 Nobutoh ................ 438/672

* cited by examiner

*Primary Examiner* — Tran Tran
(74) *Attorney, Agent, or Firm* — Wade J. Brady, III; Frederick J. Telecky, Jr.

(57) ABSTRACT

A semiconductor structure is formed in the metal interconnect structure of an integrated circuit in a method that provides either two individual resistors that are vertically isolated from each other, or a metal-insulator-metal (MIM) capacitor. As a result, both semiconductor resistors and MIM capacitors can be formed in the same process flow.

9 Claims, 13 Drawing Sheets

SEMICONDUCTURE STRUCTURE AND METHOD OF FORMING THE SEMICONDUCTOR STRUCTURE THAT PROVIDES TWO INDIVIDUAL RESISTORS OR A CAPACITOR

This application is a division of application Ser. No. 12/789,539 filed May 28, 2010, entitled "SEMICONDUCTURE STRUCTURE AND METHOD OF FORMING THE SEMICONDUCTOR STRUCTURE THAT PROVIDES TWO INDIVIDUAL RESISTORS OR A CAPACITOR", which is hereby incorporated by reference in its entirety for all purposes.

BACKGROUND OF THE INVENTION

1. Field of the Invention

The present invention relates to semiconductor structures and, more particularly, to a semiconductor structure and a method of forming the semiconductor structure that provides either two individual resistors that are vertically isolated from each other, or a metal-insulator-metal (MIM) capacitor.

2. Description of the Related Art

A semiconductor resistor is a well-known structure that is commonly implemented as a strip of conducting semiconductor material. As with conventionally-formed discrete resistors, semiconductors resistors provide a predefined resistance to the flow of current through the semiconductor resistor.

A semiconductor capacitor is also a well-known structure that includes two conductive plates that are separated by a dielectric material. As with conventionally-formed discrete capacitors, semiconductor capacitors store energy in an electric field that exists across the two plates when a potential difference exists across the two plates.

Semiconductor resistors and capacitors are frequently implemented in the metal interconnect structure of an integrated circuit. One of the drawbacks of forming semiconductor resistors and capacitors in the metal interconnect structure is that it often takes a number of additional masking steps to form these devices, e.g., three or more separate masking steps to form a semiconductor resistor, and one or more separate masking steps to form a semiconductor capacitor. Thus, four or more additional masking steps can be required to include both resistors and capacitors in the metal interconnect structure.

In addition, when one of the plates of the capacitor is formed at the same time that a layer of metal traces is formed in the metal interconnect structure, the breakdown of the dielectric can be significantly reduced due to the large grain sizes of the metal used to form the metal traces, i.e., the metal used to form the metal traces is relatively rough and peaks in the rough surface reduce the distance between the plates.

Thus, there is a need for a method of forming semiconductor resistors and capacitors in the metal interconnect structure that requires fewer masking steps, and provides more uniform capacitance values.

BRIEF DESCRIPTION OF THE DRAWINGS

FIGS. 1A-9A are a series of plan views that illustrate the method, while FIGS. 1B-9B are a series of cross-sectional views that illustrate the method.

FIGS. 10A-15A are a series of plan views of the first alternate method, while FIGS. 10B-15B are a series of cross-sectional views of the first alternate method.

FIGS. 16A-18A are a series of plan views of the second alternate method, while FIGS. 16B-18B are a series of cross-sectional views of the second alternate method.

DETAILED DESCRIPTION OF THE INVENTION

FIGS. 1A-1B to 9A-9B show a series of views that illustrate an example of a method of forming a semiconductor structure 100 in accordance with the present invention. FIGS. 1A-9A show a series of plan views that illustrate the method, while FIGS. 1B-9B show a series of cross-sectional views that illustrate the method.

As described in greater detail below, the present invention is a method that forms a semiconductor structure that provides either two individual resistors that are vertically isolated from each other, or a metal-insulator-metal (MIM) capacitor, thereby allowing semiconductor resistors and MIM capacitors to be formed in the same process flow.

Figure 1A:
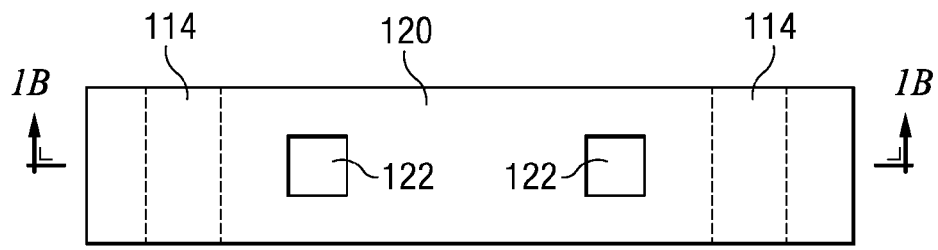
FIGS. 1A-1B to 9A-9B are a series of views illustrating an example of a method of forming a semiconductor structure 100 in accordance with the present invention.
Figure 1B:
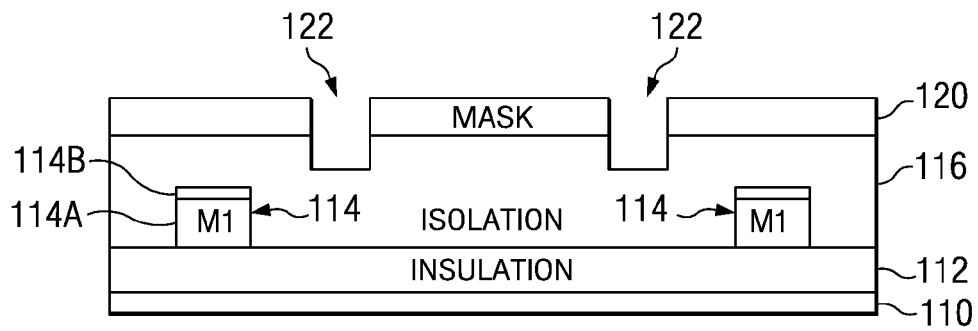

As shown in the FIGS. 1A-1B, the method utilizes a semiconductor wafer 110 which has been conventionally processed to have an insulation structure 112 that touches semiconductor wafer 110, a number of metal-1 structures 114 that touch insulation structure 112, and an isolation structure 116 that touches insulation structure 112 and the metal-1 structures 114. The metal-1 structures 114 include metal-1 traces 114A that each has an overlying silicon oxynitride layer 114B. Isolation structure 116, which has been planarized, can be implemented with an oxide that has a thickness of, for example, 4500 Å.

As further shown in FIGS. 1A-1B, the method begins by forming and patterning a mask 120 on the top surface of isolation structure 116. Following this, the exposed regions of isolation structure 116 are etched to remove, for example, 1500 Å of isolation structure 116 to form a pair of spaced-apart openings 122. Each opening 122 can have, for example, a 1 μm diameter. Mask 120 is then stripped (e.g., using conventional ashing procedures), and the top surface of isolation structure 116 is cleaned (e.g., using conventional solvents and procedures).

Figure 2A:
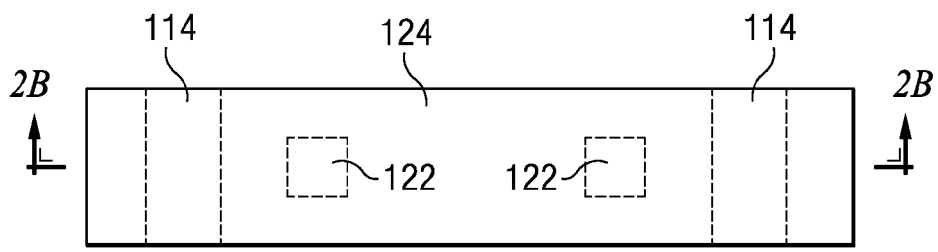
Figure 2B:
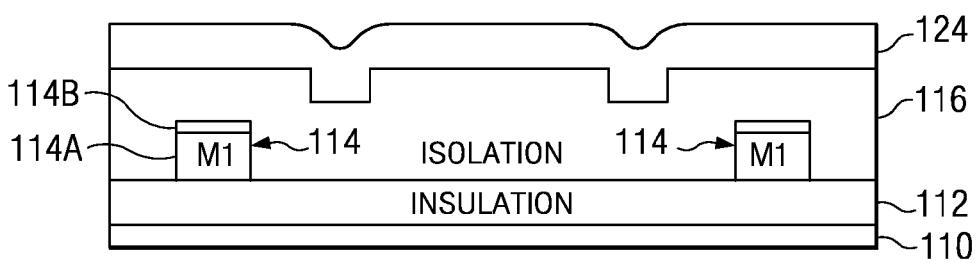

Next, as shown in FIGS. 2A-2B, a metallic layer 124 is formed on the top surface of isolation structure 116 to fill up the openings 122. Metallic layer 124 can be formed from, for example, 50 Å of titanium followed by 1600 Å of titanium nitride. The titanium layer is used to improve adhesion, and can be omitted if the adhesion of the titanium nitride layer is satisfactory. The titanium and titanium nitride layers can be, for example, sputter deposited.

Figure 3A:
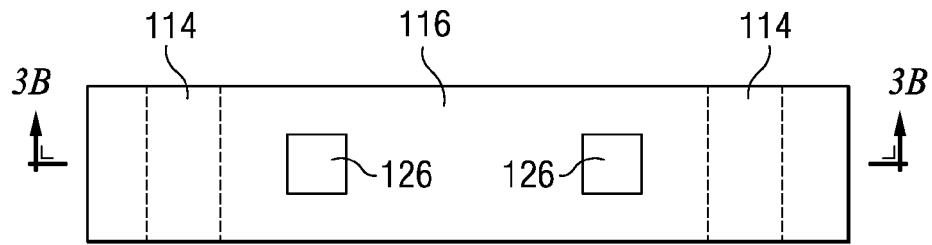
Figure 3B:
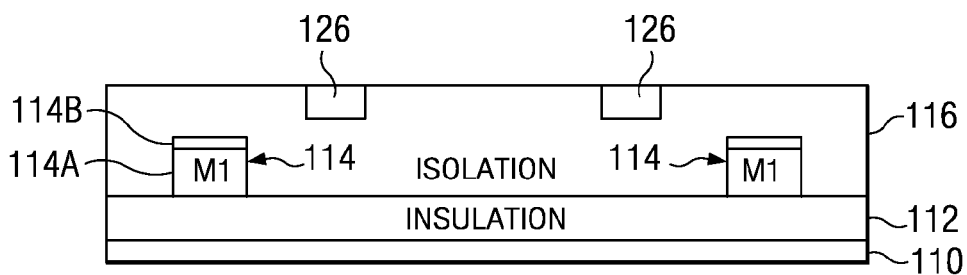

After this, as shown in FIGS. 3A-3B, metallic layer 124 is removed from the top surface of isolation structure 116, along with a portion, such as 500 Å, of the top surface of isolation structure 116 to form a pair of spaced-apart landing pads 126. For example, metallic layer 124 and the portion of the top surface of isolation structure 116 can be removed using conventional chemical mechanical polishing processes.

Thus, in the above example, following the chemical mechanical polishing, the landing pads 126 have 50 Å of titanium and 950 Å of titanium nitride. (A 50 Å sputter clean can optionally follow the chemical mechanical polishing to smooth the surface and promote adhesion of the following resistor layer.)

Figure 4A:
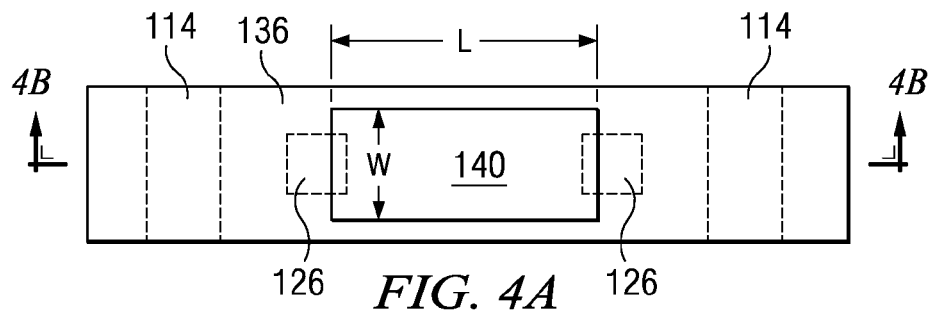
Figure 4B:
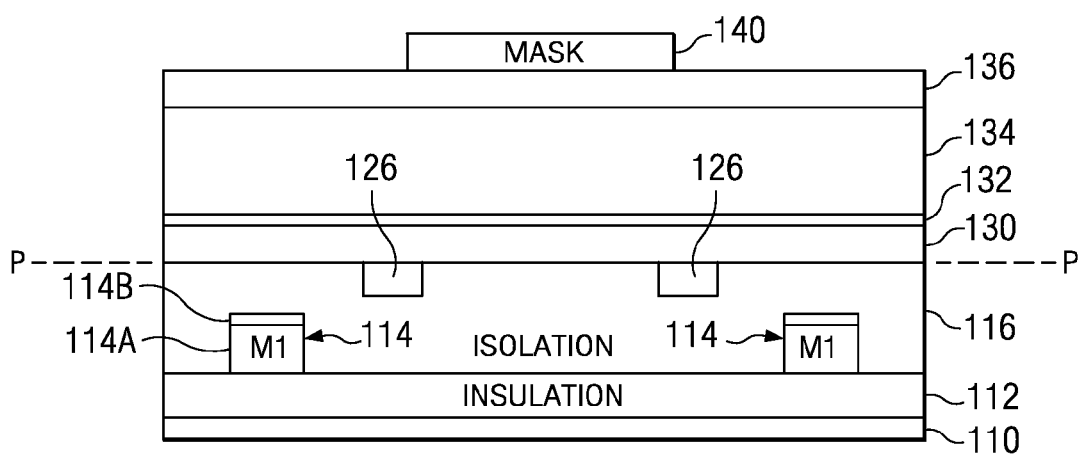

Next, as shown in FIGS. 4A-4B, a metallic layer 130 is formed on isolation structure 116 and the landing pads 126. As further shown in FIGS. 4A-4B, the top surface of isolation structure 116, the top surfaces of the landing pads 126, and the bottom surface of metallic layer 130 lie substantially in a single plane P. (Dishing, which is a slightly non-planar surface, can result from chemical-mechanical polishing.)

Metallic layer 130 can be implemented with one of a number of different materials that include, for example, silicon carbide chrome (SiCCr), nickel chrome (NiCr), titanium nitride (TiN), and tantalum nitride (TaN). The thickness of metallic layer 130 is dependent on the desired resistance of metallic layer 130. For example, a resistance of 1000 ohms/square can be realized with 75 Å-100 Å of SiCCr. Metallic layer 130 can be formed using, for example, sputter deposition with a low energy power supply at a wafer temperature of 40° C.

After metallic layer 130 has been formed, a dielectric layer 132 is formed on all of metallic layer 130. Dielectric layer 132 can be implemented with a number of different materials that include, for example, silicon oxide, silicon nitride, silicon oxynitride, and aluminum nitride, as well as with any high-K dielectric material, such as tantalum pentoxide. In addition, dielectric layer 132 is formed to be as thin as possible. Dielectric layer 132 can have a thickness of, for example, 100 Å-300 Å with the thickness determined by the limitations of the deposition tool.

Once dielectric layer 132 has been formed, a metallic layer 134 is formed on all of dielectric layer 132. Metallic layer 134 can be implemented with one of a number of different materials that include, for example, silicon carbide chrome (SiCCr), nickel chrome (NiCr), titanium nitride (TiN), and tantalum nitride (TaN). The thickness of metallic layer 134 is dependent on the desired resistance of metallic layer 134.

For example, if a resistance of 1000 ohms/square can be realized with 75 Å-100 Å of SiCCr, then a resistance of 200 ohms/square can be realized with 375 Å-500 Å of SiCCr, while a resistance of 100 ohms/square can be realized with 750 Å-1000 Å of SiCCr. Metallic layer 134 can be formed using, for example, sputter deposition with a low energy power supply at a wafer temperature of 40° C.

As further shown in the FIGS. 4A-4B example, once metallic layer 134 has been formed, a protective layer 136 is formed on all of metallic layer 134 to have a thickness of, for example, 300 Å-500 Å. Protective layer 136, which is non-conductive, can be implemented with, for example, silicon oxide or silicon oxynitride.

Following the formation of protective layer 136, a mask 140 is next formed and patterned on protective layer 136. Mask 140 is patterned to have a top surface with a shape which, in the present example, is rectangular with a width W and a length L that is, for example, 2-4 µM wide by 40 µM long, although other shapes and dimensions can alternately be used. In addition, the mask grade and photo process preferably accommodate the formation of matching side-by-side resistors with a variation of no more than 0.1% (3 sigma).

Figure 5A:
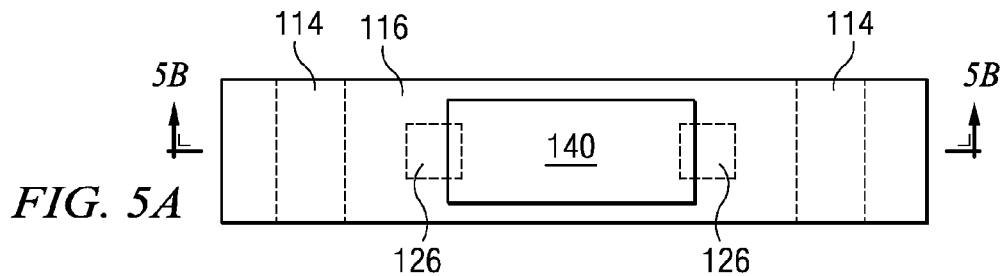
Figure 5B:
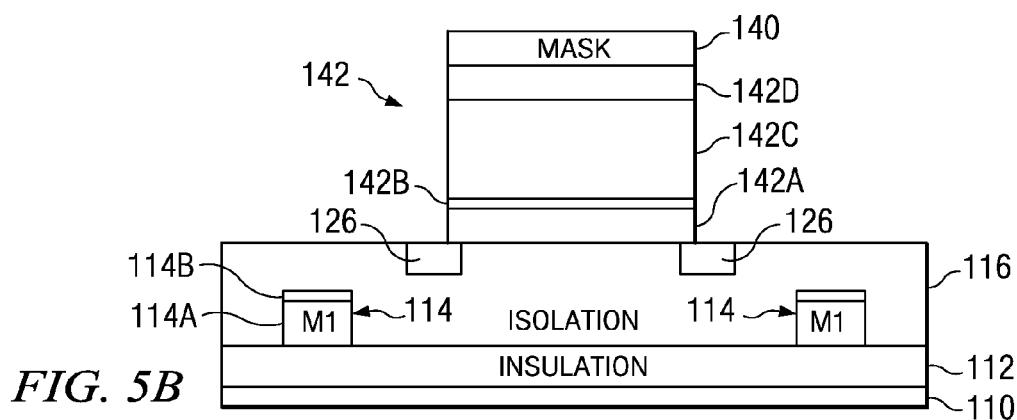

After this, as shown in FIGS. 5A-5B, the exposed regions of protective layer 136, metallic layer 134, dielectric layer 132, and metallic layer 130 are etched to form a semiconductor structure 142. Semiconductor structure 142, in turn, includes a first metallic structure 142A, a dielectric structure 142B, a second metallic structure 142C, and a protective structure 142D.

As a result of the shape and size of mask 140, semiconductor structure 142 also has a top surface with a rectangular shape that is 2-4 µM wide by 40 µM long, although other shapes and dimensions can alternately be formed as defined by the shape and size of mask 140. Thus, due to the etch, second metallic structure 142C lies directly over all of first metallic structure 142A, while the top surface of first metallic structure 142A and the top surface of second metallic structure 142C have substantially identical shapes.

Protective layer 136, metallic layer 134, dielectric layer 132, and resistor layer 130 can be etched using, for example, a conventional oxide plasma (such as is used to form via openings) with an amount of argon added to the oxide plasma to provide a sputtering effect that facilitates the removal of the metallic layers 130 and 134.

The etch is difficult to control, and tends to remove, for example, 500 Å-600 Å of the landing pads 126 and 1000 Å of isolation structure 116. If excessive amounts of the landing pads 126 are removed during the etch, then the openings 122 shown in FIGS. 1A-1B can be formed to be deeper, thereby forming thicker landing pads 126. Once semiconductor structure 142 has been formed, mask 140 is then stripped (e.g., using conventional ashing procedures), and the top surface of protective layer 136 is cleaned (e.g., using conventional solvents and procedures).

Figure 6A:
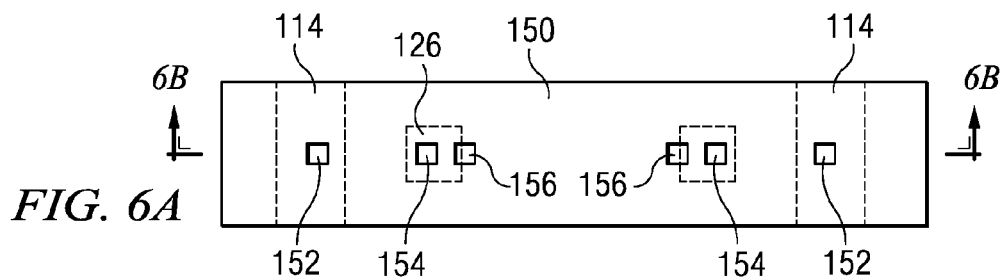
Figure 6B:
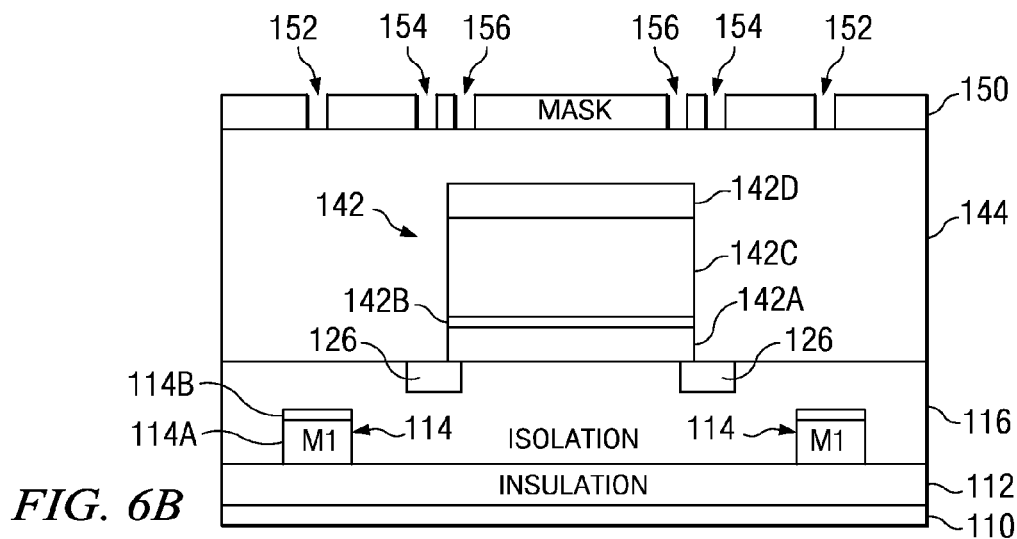

As shown in FIGS. 6A-6B, after mask 140 has been removed, an isolation layer 144 is formed on isolation structure 116, the landing pads 126, and semiconductor structure 142, and then planarized. Isolation layer 144 can be formed in a conventional manner, such as by depositing plasma oxide ($SiH_4$), and planarized in a conventional manner, such as with chemical-mechanical polishing.

Further, the thickness of isolation layer 144 must be sufficient to replace the amount of isolation structure 116 that is lost during the etch that forms semiconductor structure 142, and cover semiconductor structure 142 after isolation layer 144 has been planarized. For example, if 1000 Å of isolation structure 116 is removed during the etch that forms semiconductor structure 142, and semiconductor structure 142 is approximately 600 Å thick, then isolation layer 144 can be formed to be 1.5× to 2× this combined thickness, or 2400 Å-3200 Å thick.

Following the formation of isolation layer 144, a mask 150 is formed and patterned on isolation layer 144. Mask 150 has openings 152 that lie over the metal-1 structures 114, a pair of openings 154 that lie over the landing pads 126, and a pair of spaced-apart openings 156 that lie over semiconductor structure 142.

Figure 7A:
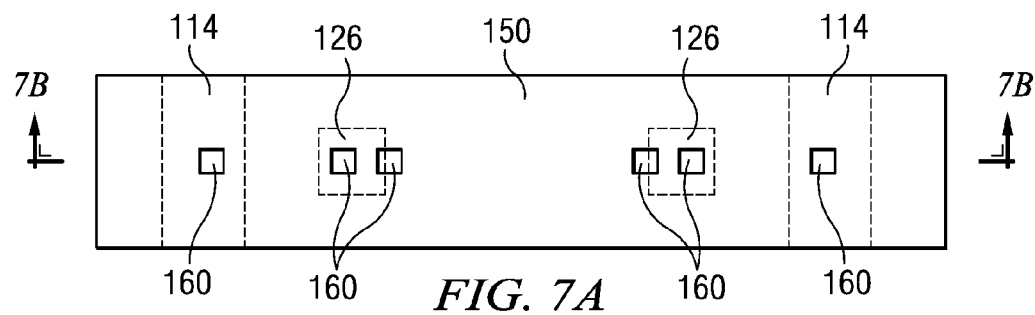
Figure 7B:
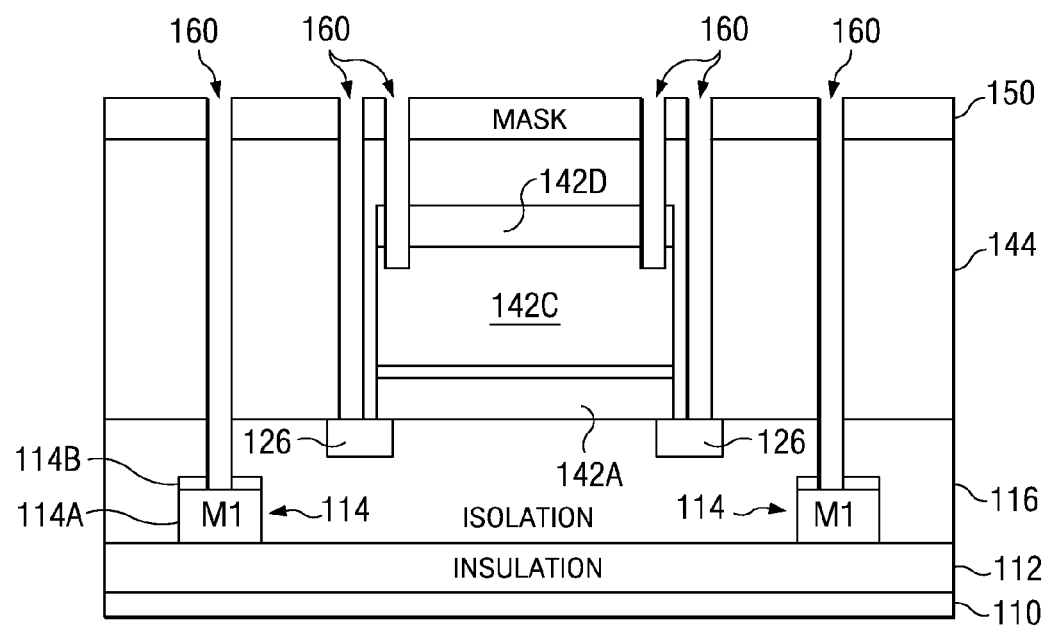

Next, as shown in FIGS. 7A-7B, isolation layer 144 and portions of the underlying isolation structure 116 and protective structure 142D are etched to form via openings 160 that expose the top surfaces of the metal-1 traces 114A, the top surfaces of the landing pads 126, and the top surface of second metallic structure 142C.

By selecting isolation layer 144 and protective structure 142D to have different etch rates, and by varying the thickness of the landing pads 126 and the protective layer 136, the via etch can be prevented from etching through the landing pads 126 and/or the second metallic structure 142C during the time required to expose the top surfaces of the metal-1 traces 114A.

As a result, the top surfaces of the metal-1 traces 114A, the top surfaces of the landing pads 126, and the top surface of second metallic structure 142C can be exposed with a single etch. (At the cost of additional masking steps, multiple etches can also be used to expose these structures). Mask 150 is then stripped (e.g., using conventional ashing procedures), and the top surface of isolation layer 144 is cleaned (e.g., using conventional solvents and procedures).

Figure 8A:
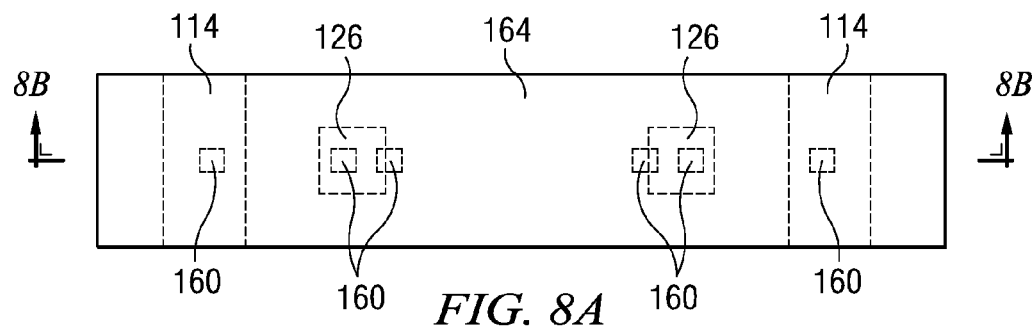
Figure 8B:
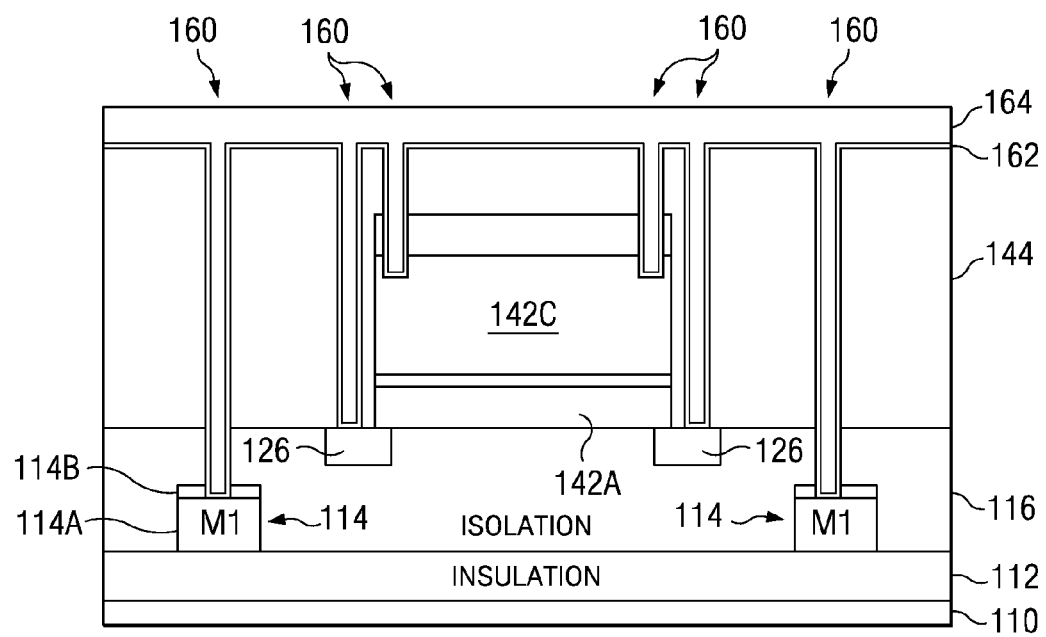

As shown in FIGS. 8A-8B, after mask 150 has been stripped, a via liner 162, such as a layer of titanium followed by a layer of titanium nitride, is next formed on isolation layer 144 and in the via openings 160. Following this, a metallic layer 164, such as tungsten, is formed on via liner 162 to fill up via openings 160.

Figure 9A:
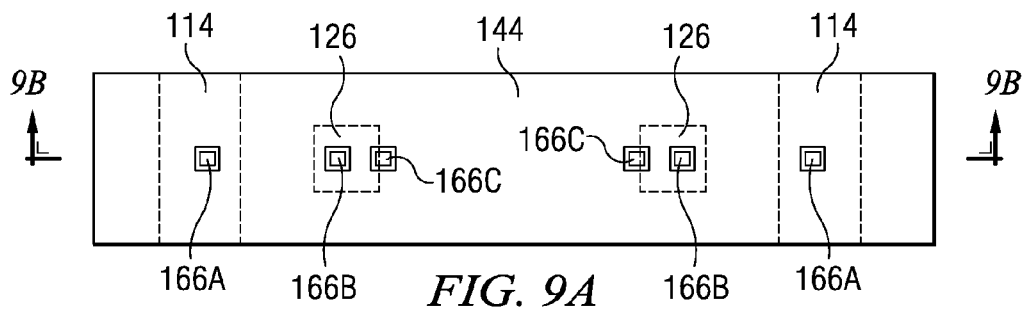
Figure 9B:
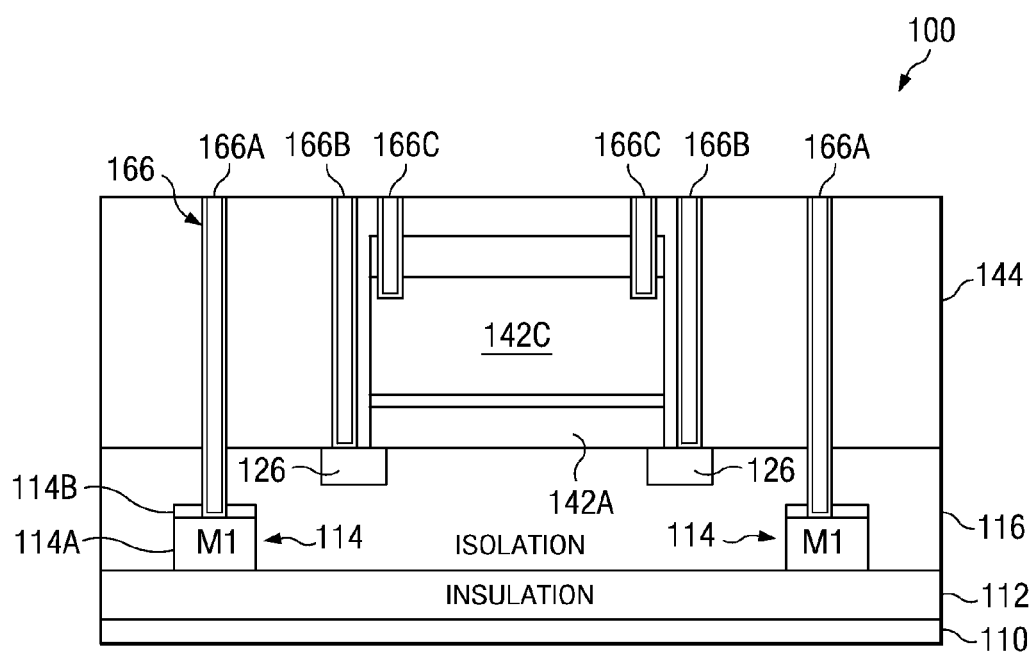

After this, as shown in FIGS. 9A-9B, metallic layer 164 and via liner 162 are removed from the top surface of isolation layer 144, along with a portion, such as 500 Å, of the top surface of isolation layer 144 to form a number of conductive vias 166, and thereby complete the formation of semiconductor structure 100.

The vias 166 include vias 166A that touch the top surfaces of the metal-1 traces 114A, vias 166B that touch the top surfaces of the landing pads 126, and vias 166C that touch the top surface of second metallic structure 142C. Metallic layer 164, via liner 162, and the portion of the top surface of isolation layer 144 can be removed using conventional chemical mechanical polishing processes. The method then continues with conventional back end processing steps.

In accordance with the present invention, semiconductor structure 100 provides two individual resistors with first metallic structure 142A forming a first resistor, such as a resistor with a resistance of 1000 ohms/square, while second metallic structure 142C forms a second resistor, such as a resistor with a resistance of 200 ohms/square.

As a result, the present invention enables the formation of both a low value resistor and a high value resistor. Thus, one of the advantages of the invention is that the present process flow provides a designer with the option to use a low value resistor, a high value resistor, or both a low value resistor and a high value resistor.

FIGS. 10A-10B to 15A-15B show a series of views that illustrate an example of a method of forming a semiconductor structure 1000 in accordance with a first alternate embodiment of the present invention. FIGS. 10A-15A show a series of plan views of the first alternate method, while FIGS. 10B-15B show a series of cross-sectional views of the first alternate method.

Figure 10A:
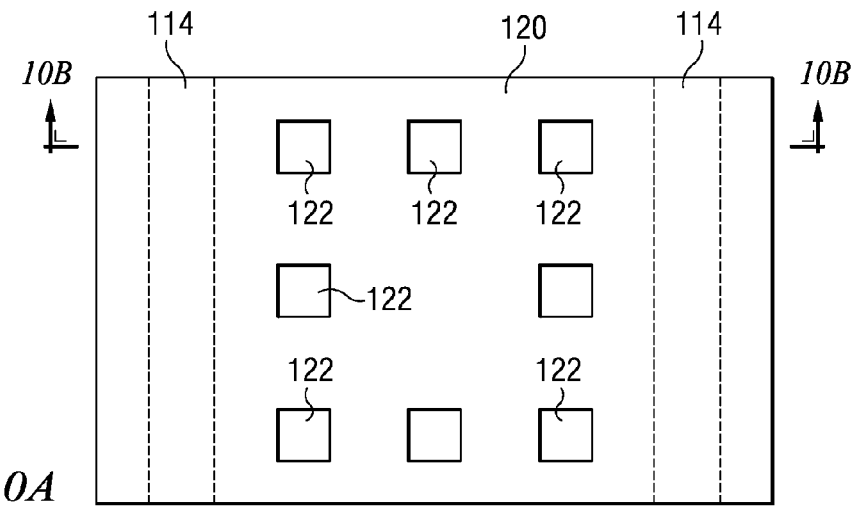
FIGS. 10A-10B to 15A-15B are a series of views illustrating an example of a method of forming a semiconductor structure 1000 in accordance with a first alternate embodiment of the present invention.
Figure 10B:
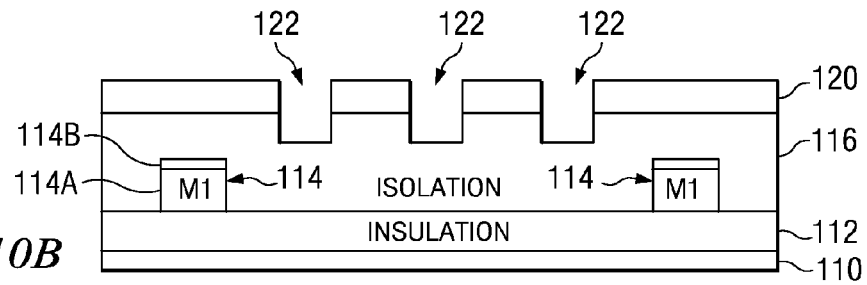

The method of the first alternate embodiment is the same as the method illustrated in FIGS. 1A-1B through 9A-9B, except that three of the masks are patterned differently. As shown in FIGS. 10A-10B, the first mask to be patterned differently is mask 120. Instead of patterning mask 120 to have a pair of openings 122 as in FIGS. 1A-1B, mask 120 is alternately patterned to have a large number of openings 122 that, taken together, form a square shape, although other shapes can be used.

Figure 11A:
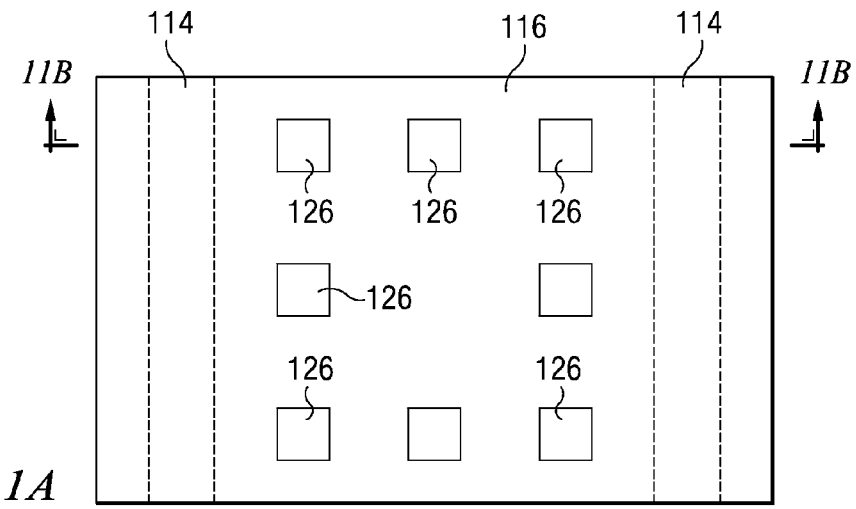
Figure 11B:
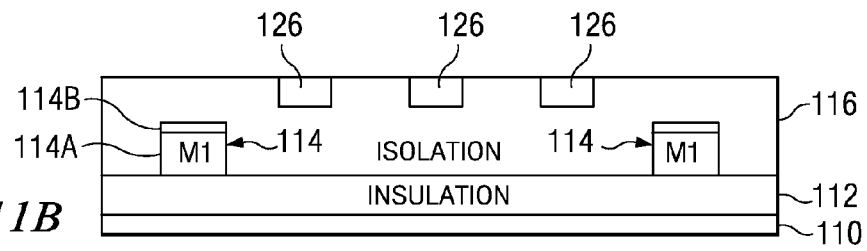

As a result, after the openings 122 have been formed, and metallic layer 124 has been deposited and then subsequently removed as described above, a large number of landing pads 126 are formed as shown in FIGS. 11A-11B instead of the pair of landing pads as in FIGS. 3A-3B.

Figure 12A:
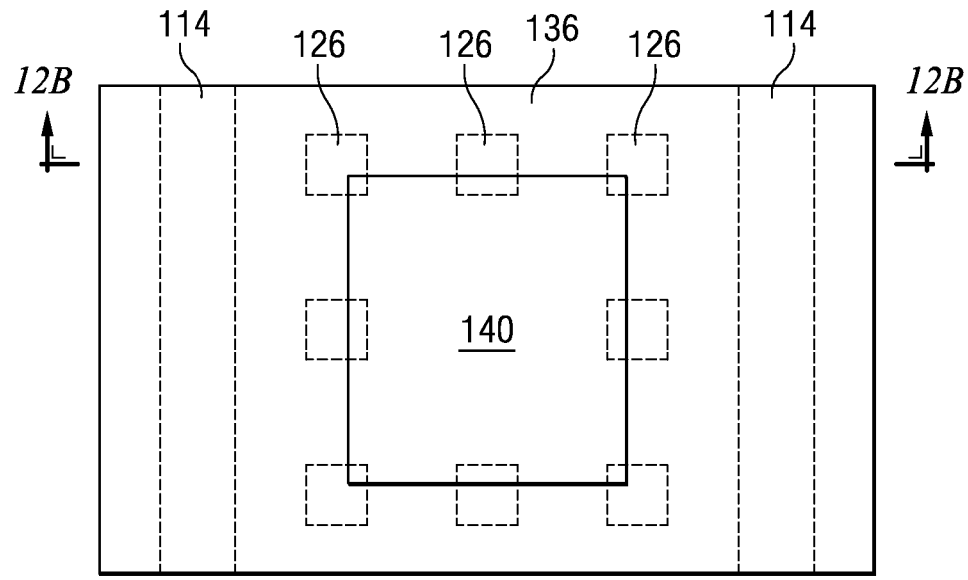
Figure 12B:
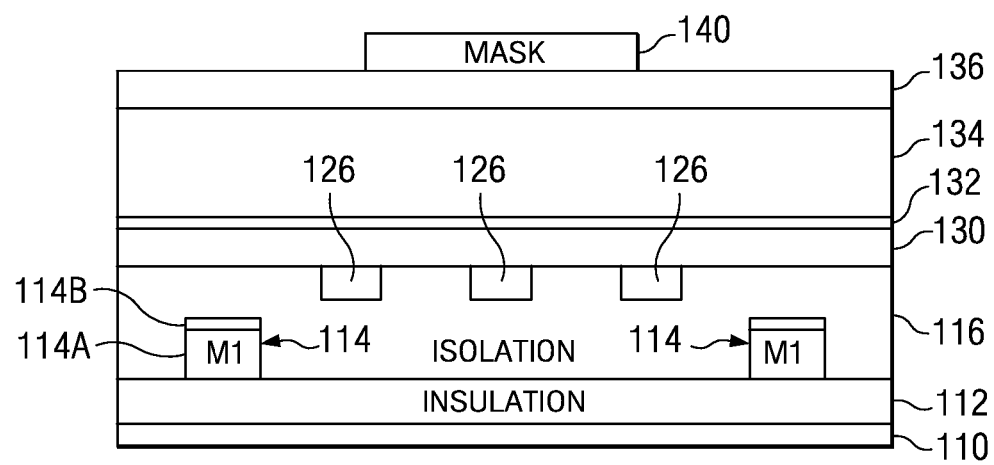

As shown in FIGS. 12A-12B, the second mask to be patterned differently is mask 140. Instead of patterning mask 140 to have a rectangular shape, mask 140 is alternately patterned to have, for example, a top surface with a square shape that is 40 µM by 40 µM, although other shapes can be used. In addition, the mask grade and photo process preferably accommodate the formation of matching side-by-side capacitors with a variation of no more than 0.1% (3 sigma).

Figure 13A:
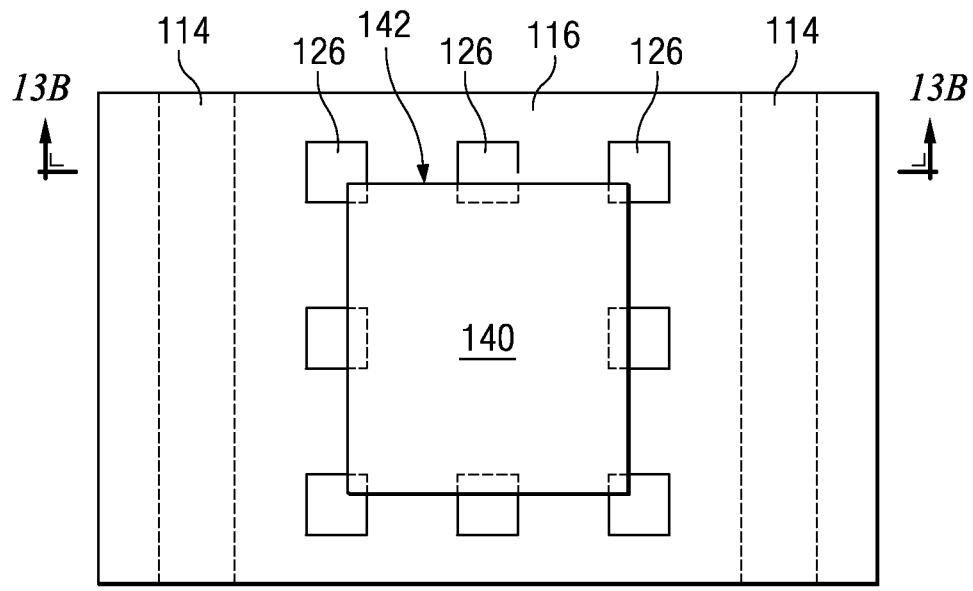
Figure 13B:
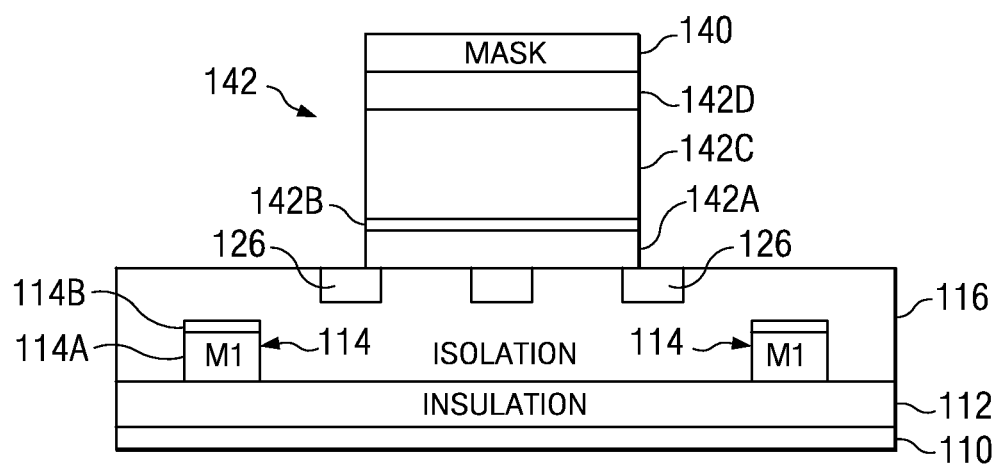

As a result, after the exposed regions of protective layer 136, metallic layer 134, dielectric layer 132, and metallic layer 130 have been etched as described above, semiconductor structure 142 is formed as shown in FIGS. 13A-13B to have, for example, a square shape that is 40 µM by 40 µM (although other shapes can be formed as defined by the shape of mask 140) that lies over each of the landing pads 126 instead of the rectangular shape as shown in FIGS. 5A-5B. Thus, in the present example, the large number of landing pads 126 extend around the periphery of first metallic structure 142A.

Figure 14A:
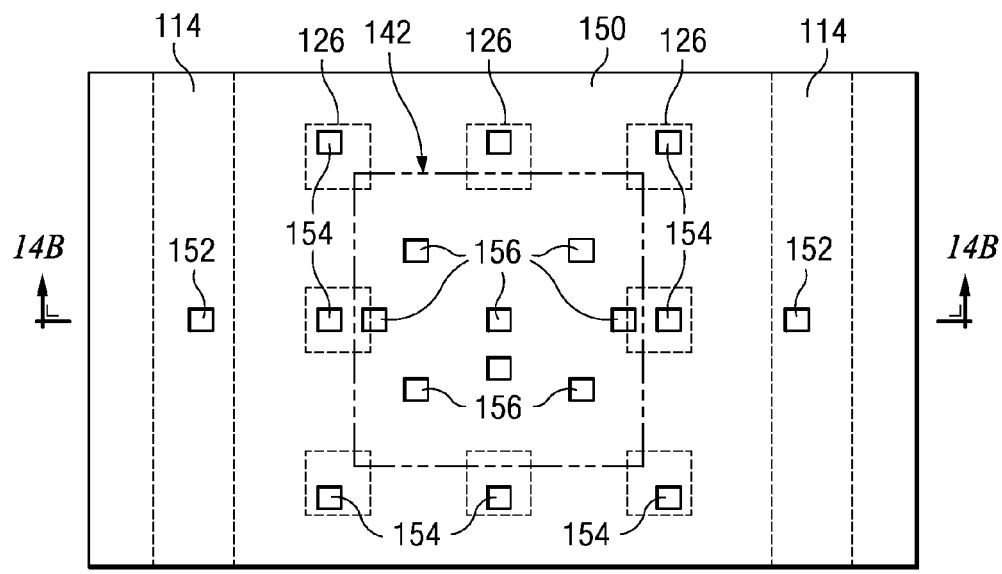
Figure 14B:
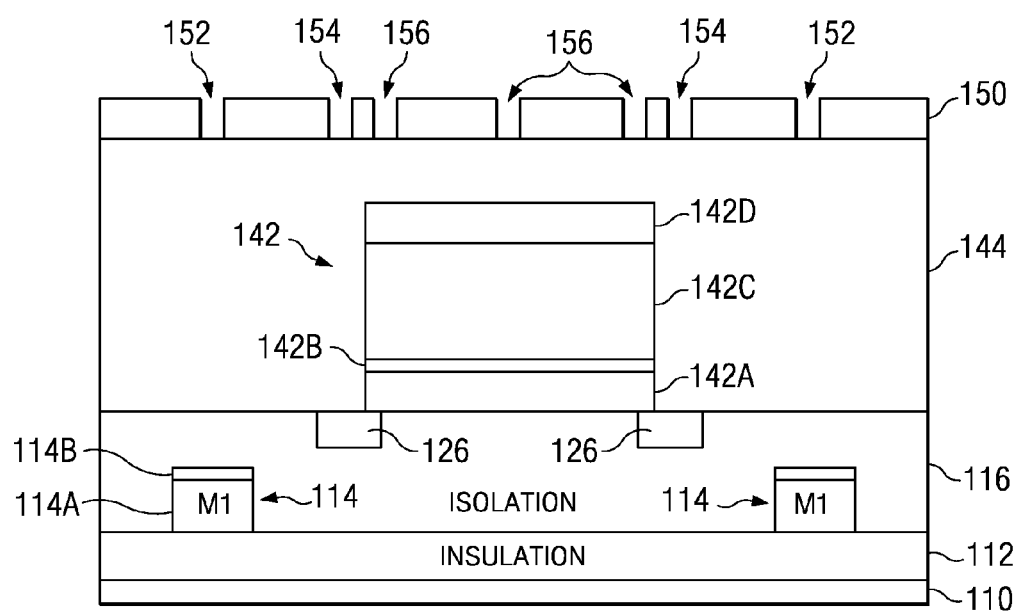

As shown in FIGS. 14A-14B, the third mask to be patterned differently is mask 150. Instead of patterning mask 150 to have a pair of openings 154 and a pair of openings 156, mask 150 is alternately patterned to have, for example, a number of openings 154 that lie over the landing pads 126, and a number of openings 156 that that lie over semiconductor structure 142.

Figure 15A:
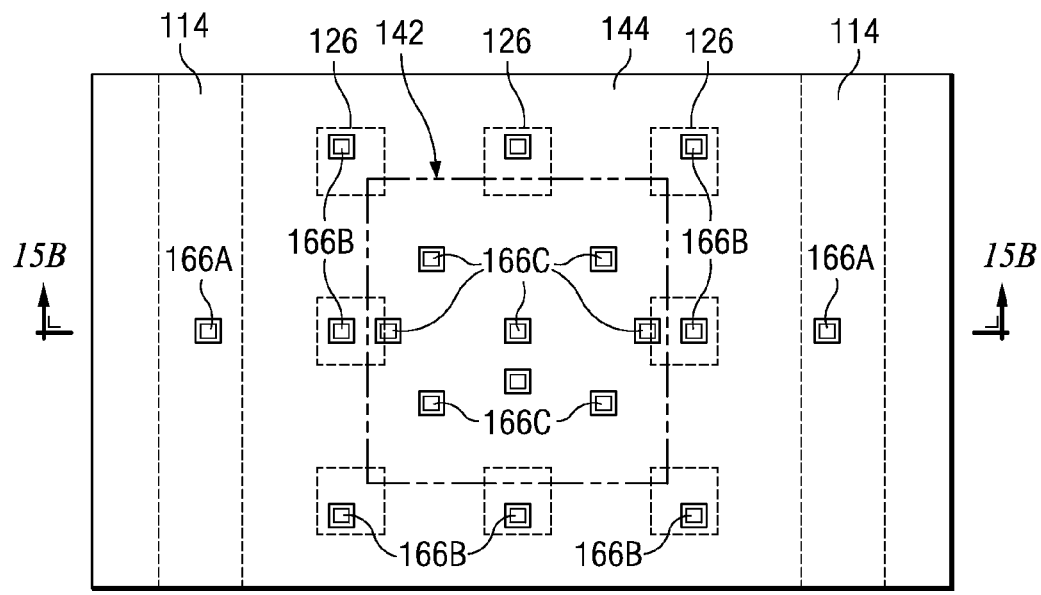
Figure 15B:
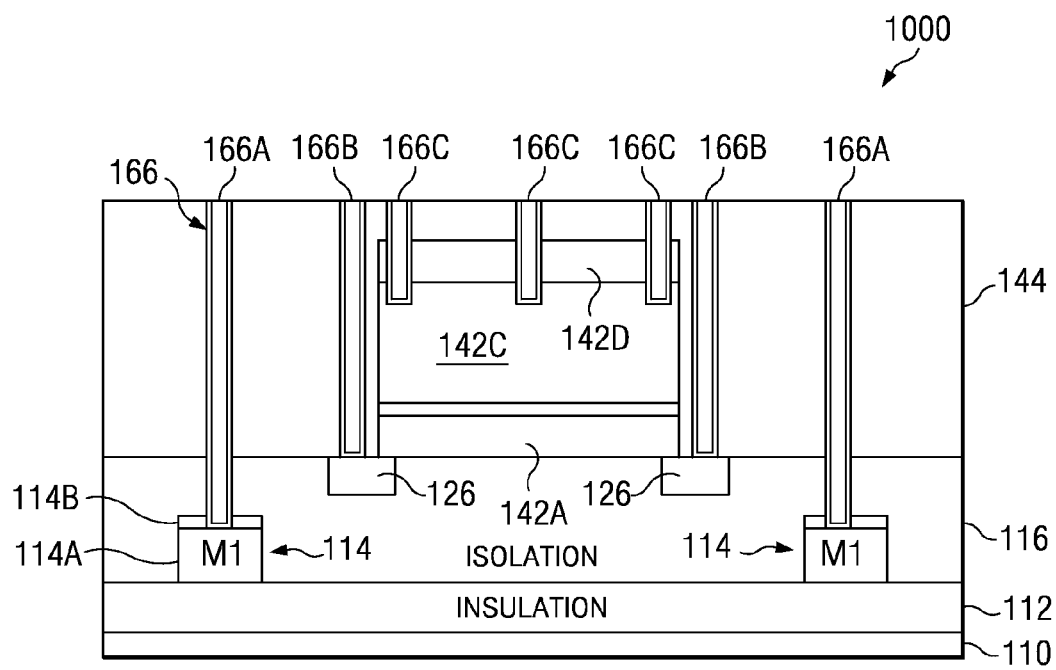

As a result, after isolation layer 144 and portions of the underlying isolation structure 116 have been etched to form the via openings 160 that expose the top surfaces of the metal-1 traces 114A, the top surfaces of the landing pads 126, and the top surface of second metallic structure 142C, and after via liner 162 and metallic layer 164 have been formed and then removed from the top surface of isolation layer 144 as described above, semiconductor structure 1000 is formed with vias 166A that touch the top surfaces of the metal-1 traces 114A, vias 166B that touch the top surfaces of the landing pads 126, and vias 166C that touch the top surface of second metallic structure 142C as shown in FIGS. 15A-15B. The method then continues with conventional back end processing steps.

In accordance with the present invention, semiconductor structure 1000 provides a capacitor with first metallic structure 142A forming the lower plate of the capacitor, while second metallic structure 142C forms the upper plate of the capacitor. One of the advantages of the present invention is that by selecting the patterns formed in masks 120, 140, and 150, one or more dual resistors, one or more capacitors, or both dual resistors and capacitors can be formed with the same number of masking steps.

Another advantage of the present invention is that the metallic structures 142A and 142C have much smoother surfaces than the rough surfaces of the metal that is used to form the metal traces. As a result, dielectric structure 142B can be thinner than the dielectric used with a capacitor where one of the plates of the capacitor is formed at the same time that a layer of metal traces is formed in the metal interconnect structure.

FIGS. 16A-16B to 18A-18B show a series of views that illustrate an example of a method of forming a semiconductor structure 1600 in accordance with a second alternate embodiment of the present invention. FIGS. 16A-18A show a series of plan views of the second alternate method, while FIGS. 16B-18B show a series of cross-sectional views of the second alternate method.

Figure 16A:
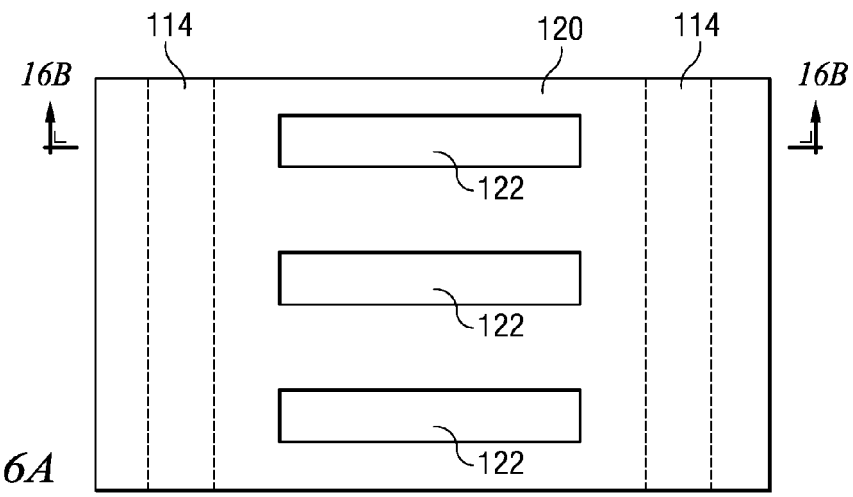
FIGS. 16A-16B to 18A-18B are a series of views illustrating an example of a method of forming a semiconductor structure 1600 in accordance with a second alternate embodiment of the present invention.
Figure 16B:
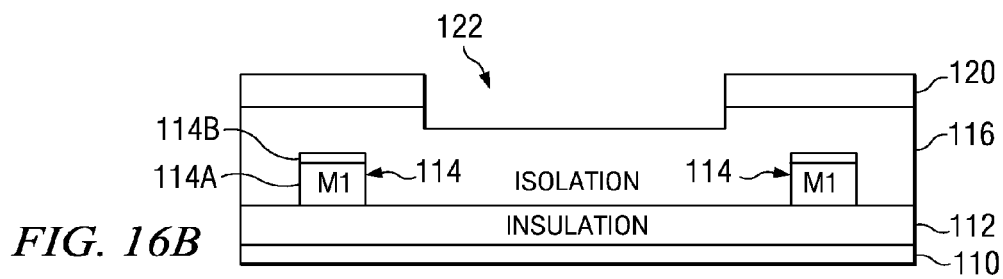

The method of the second alternate embodiment is the same as the first alternate method illustrated in FIGS. 10A-10B through 15A-15B, except that mask 120 is patterned differently. As shown in FIGS. 16A-16B, instead of patterning mask 120 to have a large number of openings 122 as shown in FIGS. 10A-10B, mask 120 is alternately patterned to form the number of openings 122 as strips that, taken together, form a square shape, although other shapes can be used.

Figure 17A:
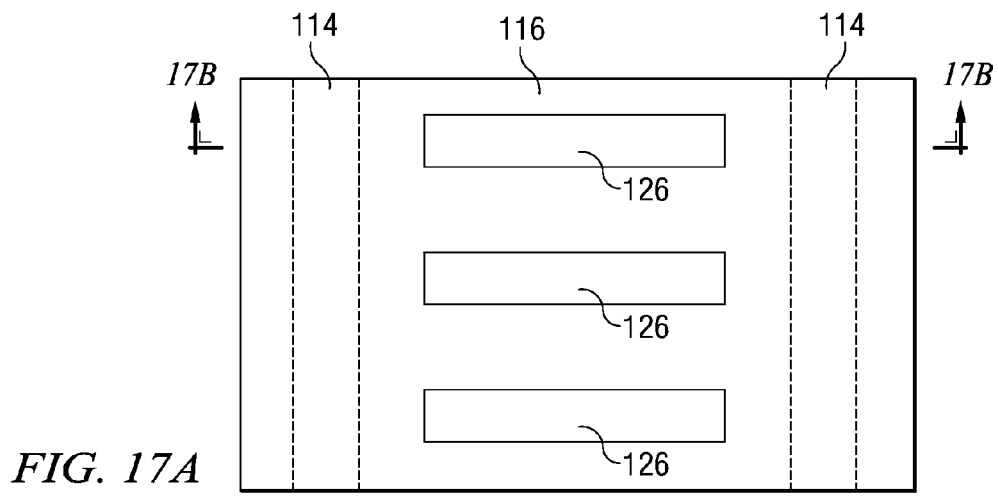
Figure 17B:
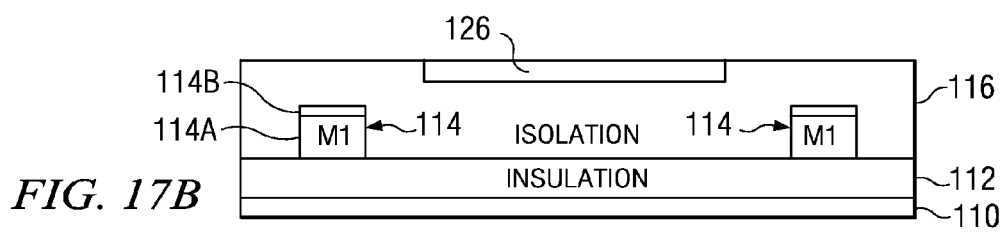

As a result, after the openings 122 have been formed, and metallic layer 124 has been deposited and then subsequently removed as described above, the landing pads 126 are formed as shown in FIGS. 17A-17B as landing strips instead of the large number of landing pads 126 as shown in FIGS. 11A-11B.

Figure 18A:
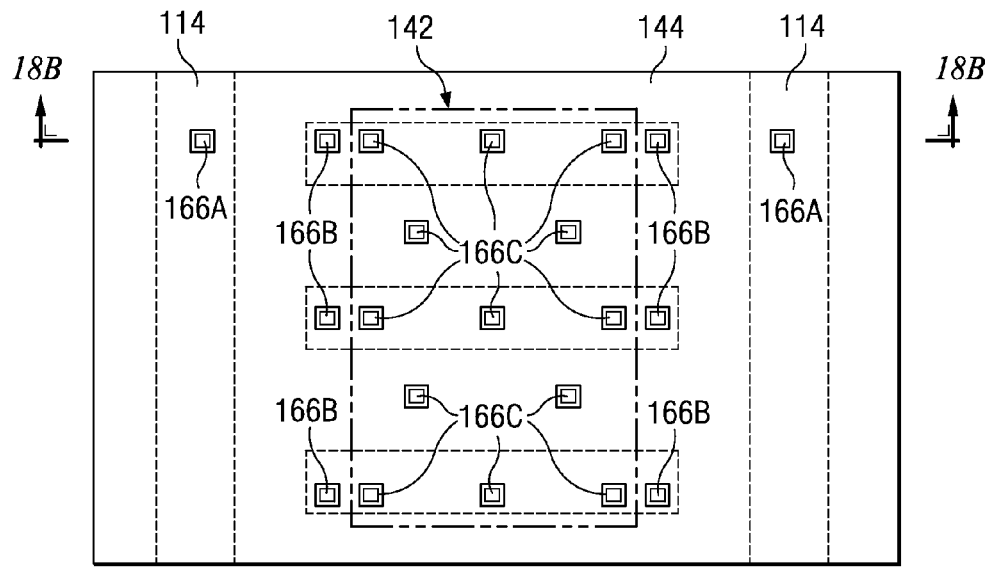
Figure 18B:
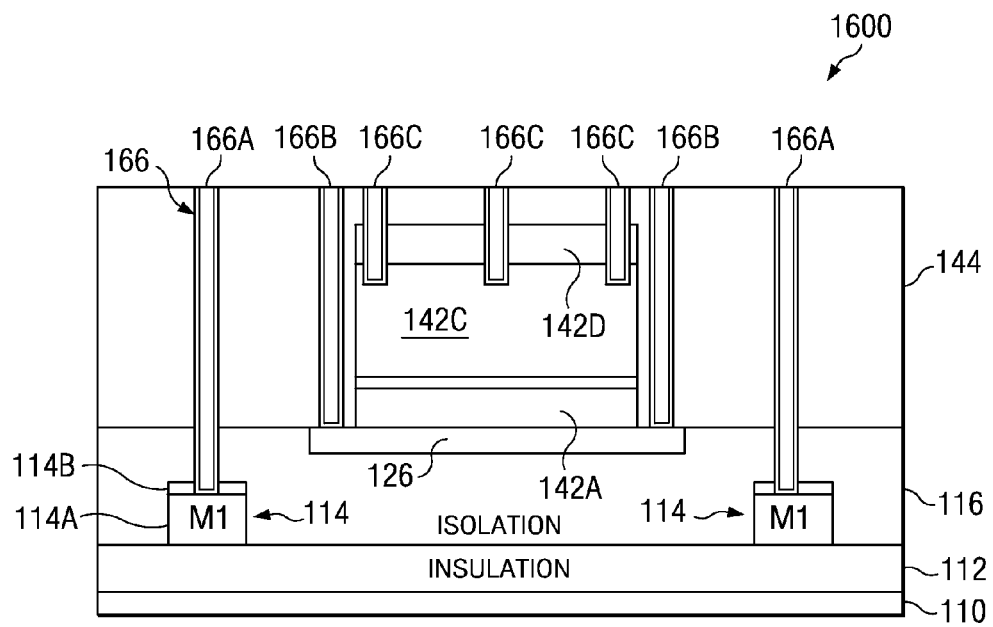

The method of the second alternate embodiment then continues the same as the first alternate method illustrated in FIGS. 10A-10B through 15A-15B to form semiconductor structure 1600 as shown in FIGS. 18A-18B. Thus, as shown in FIGS. 18A-18B, each of the landing pads 126 extend from one side of first metallic structure 142A to an opposite side of first metallic structure 142A.

In accordance with the second alternate embodiment of the present invention, the landing pads 126 shown in FIGS. 18A-18B lower the series resistance of first metallic structure 142A. For example, the landing pads 126 formed from titanium nitride have a resistance of approximately 10 ohms/square. Thus, any detrimental influence resulting from the series resistance of first metal layer 142A when functioning as the lower plate of a capacitor can be reduced by the landing pads 126 shown in FIGS. 18A-18B.

It should be understood that the above descriptions are examples of the present invention, and that various alternatives of the invention described herein may be employed in practicing the invention. For example, although the semiconductor structures 100, 1000, and 1600 are illustrated as formed below the metal-2 layer, the semiconductor structures 100, 1000, and 1600 can be formed below any metal layer. Thus, it is intended that the following claims define the scope of the invention and that structures and methods within the scope of these claims and their equivalents be covered thereby.

What is claimed is:

1. A method of forming a semiconductor structure comprising:
    forming a plurality of conductive landing pads that touch an isolation structure, the plurality of conductive landing pads being spaced apart and having a plurality of top surfaces, the first isolation structure having a top surface;
    forming a first metallic layer that touches the top surface of the first isolation structure and the plurality of top surfaces of the plurality of conductive landing pads, the first metallic layer having a top surface;
    forming a dielectric layer that touches the top surface of all of the first metallic layer, the dielectric layer having a top surface;
    forming a second metallic layer that touches the top surface of all of the dielectric layer and lies directly over all of the first metallic layer, the second metallic layer having a top surface;
    forming a protective layer that touches the top surface of the second metallic layer, the protective layer being non-conductive and having a top surface;
    forming a non-conductive layer that touches the top surface of the isolation structure, the plurality of top surfaces of the plurality of landing pads, and the top surface of the protective structure; and
    etching the non-conductive layer, the protective layer, the second metallic layer, the dielectric layer, and the first metallic layer to expose the plurality of top surfaces of the plurality of conductive landing pads and form a semiconductor structure, the semiconductor structure having a first metallic structure that touches each of the plurality of conductive landing pads, a dielectric structure that touches a top surface of the first metallic structure, a second metallic structure that touches a top surface of the dielectric structure, and a protective structure that touches a top surface of the second metallic structure.

2. The method of claim 1 wherein the top surface of the first isolation structure, the plurality of top surfaces of the plurality of conductive landing pads, and a bottom surface of the first metallic layer lie substantially in a single plane.

3. The method of claim 1 wherein the first metallic layer and the second metallic layer have different resistances.

4. The method of claim 1 wherein the plurality of conductive landing pads is two conductive landing pads.

5. The method of claim 1 wherein the plurality of conductive landing pads extend around a periphery of the first metallic structure.

6. The method of claim 1 wherein the plurality of conductive landing pads extend from one side of the first metallic structure to an opposite side of the first metallic structure.

7. The method of claim 1 and further comprising:
    forming a plurality of first vias that extend through the non-conductive layer to touch the plurality of conductive landing pads; and
    forming a plurality of second vias that extend through the non-conductive layer and the protective structure to touch the top surface of the second metallic structure.

8. The method of claim 7 wherein the plurality of second vias is two vias.

9. The method of claim 7 and further comprising forming a third via that extends through the non-conductive layer and the isolation structure to touch a metal trace, the third via having a length that is greater than a length of a second via.

* * * * *